United States Patent [19]

Takayama et al.

[11] Patent Number: 5,977,783
[45] Date of Patent: Nov. 2, 1999

[54] MULTILAYER PROBE FOR MEASURING ELECTRICAL CHARACTERISTICS

[75] Inventors: Yoshinari Takayama; Toshikazu Baba; Atsushi Hino; Ichiro Amino, all of Ibaraki, Japan

[73] Assignee: Nitto Denko Corporation, Osaka, Japan

[21] Appl. No.: 08/817,944

[22] PCT Filed: Oct. 12, 1995

[86] PCT No.: PCT/JP95/02092

§ 371 Date: Apr. 28, 1997

§ 102(e) Date: Apr. 28, 1997

[87] PCT Pub. No.: WO96/13728

PCT Pub. Date: May 9, 1996

[30] Foreign Application Priority Data

Oct. 28, 1994 [JP] Japan ................................. 8-265621
Oct. 6, 1995 [JP] Japan ................................. 7-260574

[51] Int. Cl.$^6$ ................................................. G01R 31/02
[52] U.S. Cl. ............................................. 324/754; 324/761
[58] Field of Search ................................. 324/754, 755, 324/72.5, 761, 158, 73.1; 439/67, 482; 29/826, 846, 830

[56] References Cited

U.S. PATENT DOCUMENTS 5,027,062  6/1991  Dugan et al. ............................ 324/72.5
5,177,439  1/1993  Liu et al. ................................ 324/72.5
5,575,662  11/1996 Yamamoto et al. ........................ 439/67

*Primary Examiner*—Vinh P. Nguyen
*Attorney, Agent, or Firm*—Sughrue, Mion, Zinn, Macpeak & Seas, PLLC

[57] ABSTRACT

A probe structure containing a contact part (2) formed on one side (1a) of an insulating substrate (1), a conductive circuit (3) formed on the other side (1b) of the insulating substrate (1), wherein the contact part (2) and the conductive circuit (3) are connected via a conductive path (5) formed in a through-hole (4) in the thickness direction of the insulating substrate (1). The contact part (2) has a structure containing a deep layer (1c) having a hardness of 100–700 Hk, an intermediate layer (1b) having a hardness of 10–300 Hk, and a surface layer (1a) having a hardness of 700–1200 Hk successively laminated. The surface layer (1a) preferably has a tensile stress of not more than 50 kg/mm$^2$. The probe structure maintains low and stable contact resistance in an electric test, in particular a burn-in test, of small test objects such as IC. In a test method wherein a solder bump is formed in a test object and utilized, the solder component of the test object does not adhere to the contact part (2) after testing. The probe structure suffers less from deterioration of contact state after repetitive open/close contact with the test object as compared to the initial contact state, and highly reliable electric testing can be performed.

8 Claims, 12 Drawing Sheets

MULTILAYER PROBE FOR MEASURING ELECTRICAL CHARACTERISTICS

TECHNICAL FIELD

The present invention relates to a probe structure useful for the measurement of electric characteristics of small test objects, a burn-in test performed under high temperatures and the like. More particularly, the present invention relates to a probe structure having a bump as a contact point with the test objects. Such test objects include, for example, a wafer before dicing and a bare die after dicing, both having a semiconductor element formed thereon, a chip size package including such element and a substrate of almost the same size therewith which have been integrated, one including a pad and a bump electrode of a flat or semi-spherical solder ball or gold formed thereon, and the like.

BACKGROUND ART

Conventionally, IC chips have been tested for various characteristics after packing the IC. For example, in a burn-in test which tests characteristics under high temperatures, an IC package is inserted into an IC socket set on a printed board and tested under a load voltage at a high temperature.

Due to a rapid progress in recent years of the development of large-scale integrated circuits such as chip on board, multi chip module and the like, which are prepared by combining a number of integrated circuits formed on a wafer, burn-in test and the like for various characteristics of each IC are required to be run when the IC is in a bare state before packaging, i.e., at the stage of IC chip (die level) or wafer before dicing.

One method for running a test while a chip is at a die level includes forming a flat or semi-spherical solder bump on a pad of an IC chip having a circuit formed thereon, soldering same to a contact part formed on a printed board, and testing under voltage load at a high temperature.

For testing the electric characteristics of a small test object as mentioned above, a probe card has been developed. This comprises a flexible insulating substrate and a contact part (so-called bump) that comes into contact with the contact part of the test object (Japanese Patent Unexamined Publication No. 182672/1987).

In such a probe card, the bump is required to have a lower contact resistance, and superior corrosion resistance and abrasion resistance. To meet the requirements, the outermost layer of a conventional bump has been prepared from gold or hard gold having an improved abrasion resistance achieved by adding about 0.1% nickel and cobalt to the gold, both having smaller contact resistance and superior corrosion resistance.

When gold or hard gold is used to form the outermost layer of a bump, however, the bump is susceptible to troubles such as defective continuity and varying contact resistance, since it is easily deformed upon contact with the electrode pad of a test object, thus lowering reliability as a probe to be repeatedly used for testing.

When a base metal is used as the base of said outermost layer moreover, the outermost gold layer is crushed to expose the base metal, thereby allowing oxidation and corrosion of the base metal.

When the test object is an IC and subjected to a test having a heat history as in a burn-in test, the material of its electrode pad, which is mainly aluminum, is transferred and attached to the gold on the surface of the bump and diffused to increase the contact resistance.

The base metal contained in the hard gold, such as copper and nickel, diffuses to the surface under a high temperature and is oxidized to result in a problematic high contact resistance.

When a test method includes the use of a flat or semi-spherical solder bump formed on the pad of an IC chip, as mentioned above, the solder of the solder bump is heated after testing to melt same and remove the IC chip. This changes the size, volume and shape of the bump formed on the pad of the IC chip, necessitating re-forming of the solder bump. Moreover, the solder remains at the contact part on the printed board after removing the IC, and the solder should be removed every time a timing is run.

Such problems are not specific to a bare chip wafer alone but found with regard to a chip size package wherein an IC chip is integrated with a substrate having the same size with the chip.

Thus, the present invention aims at solving the conventional problems as mentioned above and maintaining low and stable contact resistance in an electric test, particularly a burn-in test, of small test objects such as wafer, IC, semiconductor element, chip size package and the like. In a test method wherein a solder bump is formed on a test object and used, moreover, the invention aims at preventing the solder component of the test object from adhering to the contact part of the probe structure after testing; in other words, the invention aims at preventing loss in volume of the solder component of the test object. Moreover, the present invention aims at performing a highly reliable test with less degradation of the contacting state from that of the initial state, even after repetitive open/close contact with the test object.

DISCLOSURE OF THE INVENTION

The above-mentioned objects can be achieved by the following probe structures of the present invention.

(1) A probe structure comprising a conductive contact part formed on one side of an insulating substrate and a conductive circuit formed on the other side of the insulating substrate, wherein the contact part and the conductive circuit are contained via a conductive path formed in a through-hole in the thickness direction of the insulating substrate, and the contact part comprises (a) a deep layer having a hardness of 100–700 Hk (not less than 100 Hk and not more than 700 Hk, hereinafter the same), (b) an intermediate layer having a hardness of 10–300 Hk and (c) a surface layer having a hardness of 700–1200 Hk successively laminated on top of each other.

Note that "Hk" is a unit of Knoop hardness.

(2) The probe structure of (1) above, wherein the contact part comprises a rhodium surface layer, a gold middle layer, and a nickel layer or a copper layer or a laminate of or a nickel layer and a copper layer as a deep layer.

(3) The probe structure of (1) or (2) above, wherein the intermediate layer at the contact part has a thickness of 0.01–3 μm and the surface layer at the contact part has a thickness of 0.5–10 μm.

(4) The probe structure of any one of (1) to (3) above, wherein the surface layer at the contact part has a tensile stress of not more than 50 kg/mm$^2$.

(5) The probe structure of any one of (1) to (4) above, wherein at least one of the surface layer, the intermediate layer and the deep layer at the contact part is formed by plating.

As mentioned earlier, the probe structure of the present invention comprises a conductive contact part having three layers of a deep layer, an intermediate layer and a surface layer, wherein the action of each layer and the entire structure are as mentioned below.

The deep layer is, like a known bump contact, a conductive path of an electric signal and functions as the base or the core of the center portion of the contact part and imparts strength to the contact part.

The intermediate layer absorbs and relaxes the stress generated in the contact part due to the contact pressure applied to the surface layer. It also preferably adheres the surface layer to the deep layer as the base of the surface layer.

The surface layer is strong against abrasion and damages. It has corrosion resistance and is capable of inhibiting transfer and diffusion of other metals from the test objects, whereby the contact resistance can be preferably maintained at a low level.

In a test method wherein a solder bump is formed for use, corrosion resistance is imparted to the surface layer, whereby transfer and diffusion from the solder bump of the test object to the contact part between the same and the bump of a probe can be suppressed. As a result, the volume of the solder bump of the test object does not reduce easily after testing.

In addition, by the combination of these three layers, the defects of each layer material can be compensated and a contact part less degraded by repetitive open/close contact is constructed.

BRIEF DESCRIPTION OF THE DRAWINGS

In FIGS. 1–10, the same reference symbols mean the same or the like portions.

MODE OF EMBODYING THE INVENTION

Figure 1:
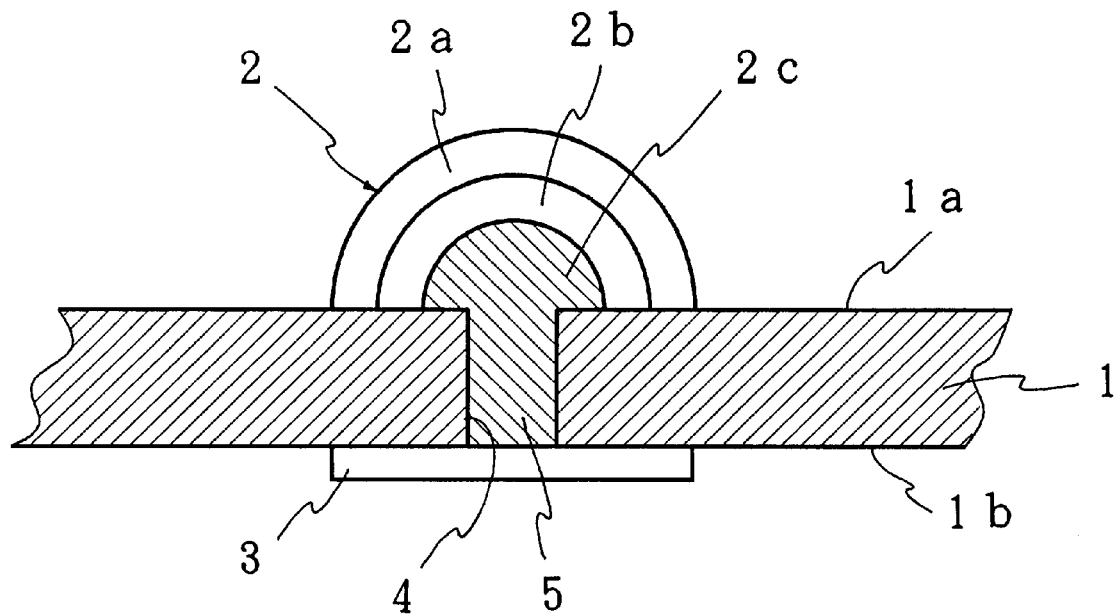
FIG. 1 is a cross section of one embodiment of the probe structure of the present invention.

The probe structure of the the present invention is described in more detail by referring to the drawings.

FIG. 1 is a cross section of one embodiment of the probe structure of the present invention. As shown in this Figure, said probe structure has a contact part 2 on one side 1a of an insulating substrate 1 and a conductive circuit 3 on the other side 1b of said insulating substrate 1, wherein the contact part 2 and the conductive circuit 3 are continued via a conductive path 5 formed inside a through-hole 4 in the thickness direction of said insulating substrate 1, and the contact part 2 includes a deep layer 2c, an intermediate layer 2b and a surface layer 2a, each having the hardness and characteristics described in the following. This Figure shows an embodiment where the contact part 2 and the conductive path 5 are integrally formed from the same material.

While the material of the insulating substrate 1 is not particularly limited as long as it has an insulating property, it preferably has both an insulating property and flexibility. Examples thereof include thermosetting resins and thermoplastic resins such as polyester resin, epoxy resin, urethane resin, polystyrene resin, polyethylene resin, polyamide resin, polyimide resin, acrylonitrile-butadiene-styrene (ABS) copolymer resin, polycarbonate resin, silicone resin, fluororesin and the like. Of these, polyimide resins are particularly preferable in view of the superior heat resistance and mechanical strength they have, and possible adjustment to the linear expansion coefficient of the test object.

While the thickness of the insulating substrate 1 is not particularly limited, it is 2–500 $\mu$m, preferably 5–150 $\mu$m, more preferably 8–150 $\mu$m and most preferably 10–150 $\mu$m, to achieve sufficient mechanical strength and flexibility.

The conductive circuit 3 comprises, besides the circuit pattern formed using conductor.semiconductor, elements constituting the circuit, such as contact part, coil, resistor, capacitor and the like.

The material of the conductive circuit 3 is not particularly limited to conductor.semiconductor, but may be any as long as it has conductivity. Preferred are known metals having good conductivity. Examples thereof include metals such as gold, silver, copper, platinum, zinc, tin, nickel, cobalt, indium, rhodium, chromium, tungsten, ruthenium and the like, and various alloys containing these metals as components, such as solder, nickel-tin, gold-cobalt and the like.

While the thickness of the conductive circuit 3 is not particularly limited, it is preferably not less than 1 $\mu$m to make resistance of the electric circuit smaller, and preferably not more than 200 $\mu$m in view of processability in chemical etching and the like. In the proposed range, the range of 5–50 $\mu$m is particularly preferable.

The conductive circuit 3 may be formed, for example, by an additive method which includes drawing and forming a desired circuit pattern directly on the insulating substrate 1, or a subtractive method which leaves only the desired circuit pattern by removing the rest of the conductive part.

The former method includes drawing the circuit pattern by a film-forming method such as sputtering, various evaporations, various platings and the like. The latter method includes formed a conductive layer on the insulating substrate 1, forming a resist layer so that only the objective circuit pattern on said conductive layer is covered, and etching the exposed conductive layer to give the desired circuit pattern.

The through-hole 4 becomes a conductive path 5 between the contact part 2 and conductive circuit 3. For smaller electric resistance of the conductive path 5, it is preferably that the diameter thereof be made as large as possible as long as the adjacent through-holes are not joined, and the pitch thereof be made as small as possible to increase said through-hole in number per unit area.

The size of the through-hole 4 is about 5–200 $\mu$m, preferably 8–50 $\mu$m.

The through-hole 4 may be formed by, for example, mechanical perforating such as punching, plasma processing, laser processing, photolithographic processing, chemical etching using a resist having different drug resistance from the insulating substrate 1 or other method. The laser processing permits fine processing at an optional hole size and hole pitch and can satisfy fine pitch of the contact part 2. Among others, drilling processing using irradiation of eximer laser, carbon dioxide gas laser or YAG laser at controlled pulse number and energy amount is preferable because of its high precision.

Figure 2:
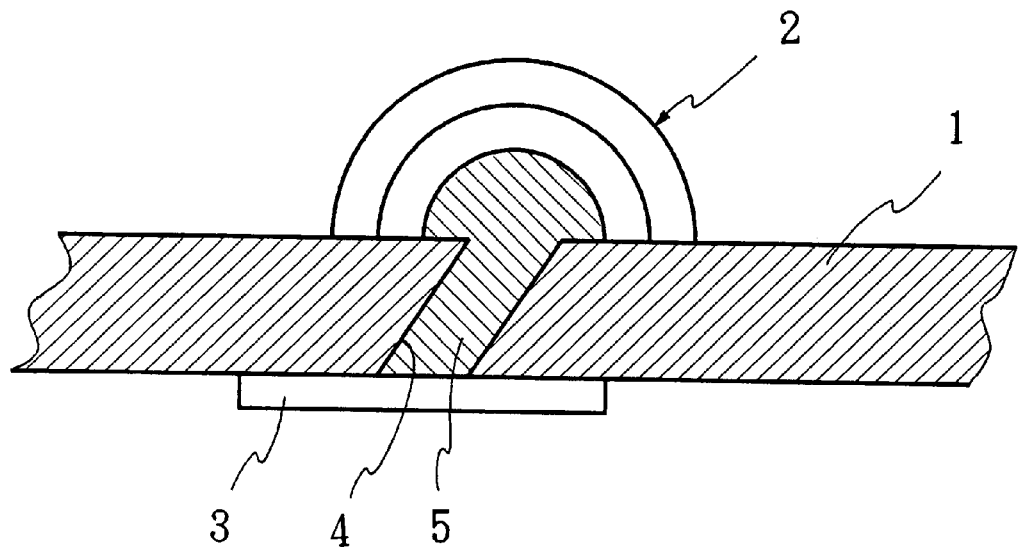
FIG. 2 is a schematic cross section of a through-hole in one embodiment of the probe structure of the present invention.

The through hole 4 can be formed in a perpendicular relation to the plane of the insulating substrate 1, or formed to make a predetermined angle with the plane of the insulating substrate 1, as shown in FIG. 2, whereby the pressure applied to the test object is divided and damages to the conductor part of the test object can be avoided.

The conductive path 5 may be any as long as it is formed within the through-hole 4 and connects the contact part 2 and conductive circuit 3. Examples thereof include one obtained by filling a conductive material in the through-hole 4 and one wherein a conductive material layer is formed on the entire circumferential wall of the through-hole 4, like a through-hole plating.

The conductive path 5 may be formed by, for example, mechanically filling a conductive material into the through-hole 4, film forming by CVD and the like, or plating method such as electrolytic plating, electroless plating and the like, with preference given to an electrolytic plating using conductive circuit 3 as an electrode because of its easiness.

The contact part 2 is a conductor part formed on the plane of the insulating substrate 1 for electric contact and connection with the test object.

The shape of the contact part 2 as a whole may or may not be a protrusion from the plane of the insulating substrate 1. The shape of the upper contact surface of the contact part 2 may be either convex, plane or concave according to protrusion or non-protrusion of the contact mate.

Therefore, the sectional shape of the contact part 2 when cut along the plane perpendicular to or parallel to the plane of substrate 1 is not limited, but can be any polygon, circle, ellipsoidal, or part or combination of these shapes. When such sectional shapes are combined, the shape of the contact part 2 may be any three dimensional shape such as the end portion or side portion of polygon or column, (truncated) cone, (truncated) pyramid, part of sphere and the like.

Consequently, the contact between the contact part and the test object may be a point contact, a line contact, a plane contact and the like.

While the height of the contact part 2 from the plane of insulating substrate 1 is not particularly limited, it is preferably about 0.1 $\mu$m-several hundred $\mu$m in the case of a small test object such as an IC. One or more contact parts can be formed for the number of contacts per one pad of the test object, and the number of the contact part is not particularly limited.

The contact part 2 has three layers of deep layer 2c, intermediate layer 2b and surface layer 2a. The deep layer 2c and conductive path 5 may be integrally formed from the same material.

The hardness of deep layer 2c is set to 100–700 Hk. When the hardness is less than 100 Hk, the contact part 2 is easily deformed when it is brought into contact with the contact mate and a pressure is applied, and when the hardness exceeds 700 Hk, cracks tend to occur easily. The more preferable range of the hardness of the deep layer 2c is 150–600 Hk and practically 150–250 Hk.

The material satisfying such hardness is exemplified by, but not limited to, economical metals having good conductivity which are used for known bumps, which are, for example, copper, nickel, nickel. palladium alloy. The deep layer 2c preferably has a single layer structure of nickel layer or copper layer or a laminate structure of nickel layer and copper layer.

The deep layer 2c and conductive path 5 are frequently formed integrally from the same material and connected to the conductive circuit 3. In this case, the material forming the deep layer 2c is preferably crystallographycally matching with the material forming the conductive circuit 3, shows good adhesion and is not easily diffused. For example, when the material of the conductive circuit 3 is copper, the material of the corresponding deep layer 2c is preferably copper, nickel or nickel alloy.

The hardness is preferably adjusted by alloying or adding an organic additive so that the insulating substrate 1 is not damaged by heat.

The hardness of the intermediate layer 2b is set to 10–300 Hk. When the hardness is less than 10 Hk, it tends to be easily deformed and when it exceeds 300 Hk, it tends to lack cushioning property. The preferable range of the hardness of the intermediate layer 2b is 50–200 Hk, particularly 50–150 Hk, and more particularly 50–100 Hk. The material satisfying such hardness is exemplified by gold, palladium, silver, indium, platinum and the like. A metal superior in adhesion to deep layer 2c and surface layer 2a and having corrosion resistance even when exposed to the surface is preferably used. In particular, when the deep layer is formed from nickel and the surface layer 2a is formed from rhodium, the intermediate layer 2b is most preferably made from gold.

The thickness of the intermediate layer 2b is 0.01–3 $\mu$m, preferably 0.1–1 $\mu$m. When it is less than 0.01 $\mu$m, it tends to have weak cushioning property. When it exceeds 3 $\mu$m, the metal of the surface layer 2a tends to break due to a greater deformation upon application of pressure.

The hardness of the surface layer 2a is set to 700–1200 Hk. When the hardness is less than 700 Hk, the surface layer 2a tends to be damaged on contact with the conductor of the test object, and when it exceeds 1200 Hk, cracks tend to occur. The preferable range of the hardness of the surface layer 2a is 800–1100 Hk, which is particularly preferably 900–1000 Hk. The material that satisfies such hardness is not particularly limited, and is exemplified by hard metals such as rhodium, ruthenium, cobalt-tungsten alloy, chromium, iron-tungsten alloy, chromium-molybdenum alloy and the like. In particular, a material having corrosion resistance, which functions as a barrier to prevent diffusion of the metal transferred from the contact object is preferably used. Examples thereof include precious metals such as rhodium and ruthenium.

When the above-mentioned precious metal is used for the surface layer 2a, this precious metal may be a single metal or alloy. It is preferably that the metal contain platinum group metal in a proportion of 99% or more, so that an increase in contact resistance due to diffusion and oxidation of the base metal on the surface, increase in inside stress due to organic impurities, and incident of cracks can be avoided.

When an alloy is used, a combination of precious metals having corrosion resistance and less diffusable is preferable. Examples thereof include a combination of rhodium and ruthenium.

Even when less diffusable rhodium and the like is used as the material of the surface layer 2a to be in contact with a metal of the pad of the test object such as aluminum and SnPb solder, it may be physically transferred as a result of an electric resistance test such as a burn-in test. This is noticeable when the test is repeated after exchanging the IC of the test object at every test object.

The transferred aluminum and solder form an oxide film to result in an increased contact resistance and poor electric reliability. For a stabilized electric resistance test, aluminum and solder transferred to the contact part 2 is preferably removed by selective etching after completion of one cycle of testing.

The method for the removing include dry etching such as argon plasma etching and wet etching including electric or chemical treatment using an etching liquid which does not corrode the base metal. The use of an alkali etching liquid is preferable in view of the absence of corrosion of the base metal. Specific examples of wet etching are given in the following.

EXAMPLE 1

Wet Etching of Aluminum Pad

```
<immersion type> anhydrous sodium carbonate            23 g/l
sodium phosphate                      23 g/l
surfactant                             2 g/l
70–80° C.
<electrolysis type> sodium hydroxide                      25 g/l
anhydrous sodium carbonate            25 g/l
sodium gluconate                      10 g/l
EDTA                                   5 g/l
38–50° C., current density: 8–10 A/dm²
```

EXAMPLE 2

Wet Etching of SnPb Solder Pad

```
<immersion type>

30% hydrogen peroxide                 40 ml/l
tetrafluoroboric acid (HBF₄)         150 ml/l
```

```
-continued room temperature
<electrolysis type> sodium hydroxide                      65 g/l
sodium gluconate                      15 g/l
50–60° C., voltage: 2–4 V
```

The thickness of the surface layer 2a is 0.5–10 μm, preferably 1–5 μm, particularly preferably 2–3 μm. When the thickness of the surface layer 2a is less than 0.5 μm, pinholes tend to occur, while when it exceeds 10 μm, cracks tend to occur.

The method for forming the contact part 2, namely, a method for laminating respective layers 2a, 2b and 2c is exemplified by pressure welding wherein foils of the metals constituting respective layers 2a–2c are pressure welded with each other, film forming methods such as ion plating, ion sputtering, CVD and the like, plating methods such as electrolytic plating and electroless plating, and the like. Of these, electrolytic plating using the conductive path 5 as an electrode is easily performed and can advantageously control quality thereof in terms of metal purity, hardness, appearance and size, thereby to reduce variations.

When the contact part 2 is formed by a plating method, a treatment to increase wettability by, for example, methanol displacement and plasma surface modification, is desirable, so that a plating liquid can be surely filled in the through-hole 4. In addition, when forming a core metal, an electric current may be supplied linearly according to the surface area to be plated, thereby to maintain a certain current density, as a result of which the internal stress of the core can be made constant and cracks can be eliminated.

In particular, when the material of the surface layer 2a is the above-mentioned platinum which is formed by plating, the flow direction and flow rate of the plating liquid can be made constant with respect to the object to be plated while swinging the object right and left in the plating liquid, and the deposit efficiency of surface layer 2a at each contact part 2 becomes constant, as a consequence of which the thickness of the surface layer 2a becomes uniform. Moreover, when plating method is employed, particularly in rhodium plating, the composition of the plating liquid and operating conditions are preferably controlled such that the tensile stress of the surface layer 2a is maintained at not more than 50 kg/mm². When it exceeds 50 kg/mm², the plating film undesirably tends to have cracks.

When the organic impurities in the plating liquid are maintained at a level of not more than 50 mg/l by chroloform extraction, the tensile stress can be advantageously maintained at not more than 50 kg/mm², thus beneficially suppressing the occurrence of cracks. Even if it exceeded 50 mg/l, however, the liquid can be regenerated once the organic matters are removed by active charcoal treatment and the like.

Figure 3:
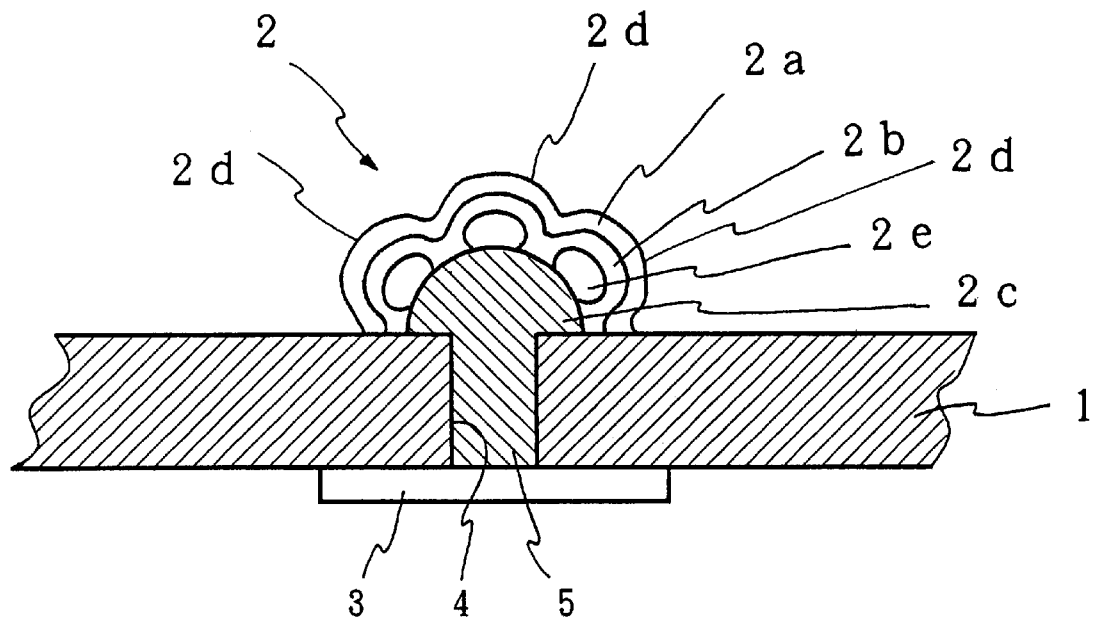
FIG. 3 is a schematic cross section of a contact part in one embodiment of the probe structure of the present invention.

In the case of a different type of test object, plural small bumps 2d are preferably formed on the deep layer 2c, as schematically shown in FIG. 3, which is one preferable example of the shape of the contact part 2. The intermediate layer 2b and the surface layer 2a are successively formed on the deep layer 2c having such small bumps 2d formed thereon, thereby making irregular surface of the contact part 2. In this way, an oxide layer and insulating layer of foreign materials formed on the conductor of the test object can be destroyed on contact with the contact part 2, whereby the contact reliability can be improved.

The above-mentioned small bump 2d can be formed by, for example, after forming deep layer 2c, metal powder 2e to be the nucleus of the small bump 2d is dispersed in a plating bath and the bath is used for electrolytic plating. The particle size of said metal powder 2e is preferably $1/200$–$1/10$ of the diameter of deep layer 2c. In addition, the use of magnetic metal powder 2e such as cobalt powder and electroplating by applying about 1–15 kilogauss magnetic field in the plating bath lead to uniform deposit of said metal powder 2e on the surface of the deep layer 2c.

Figure 4:
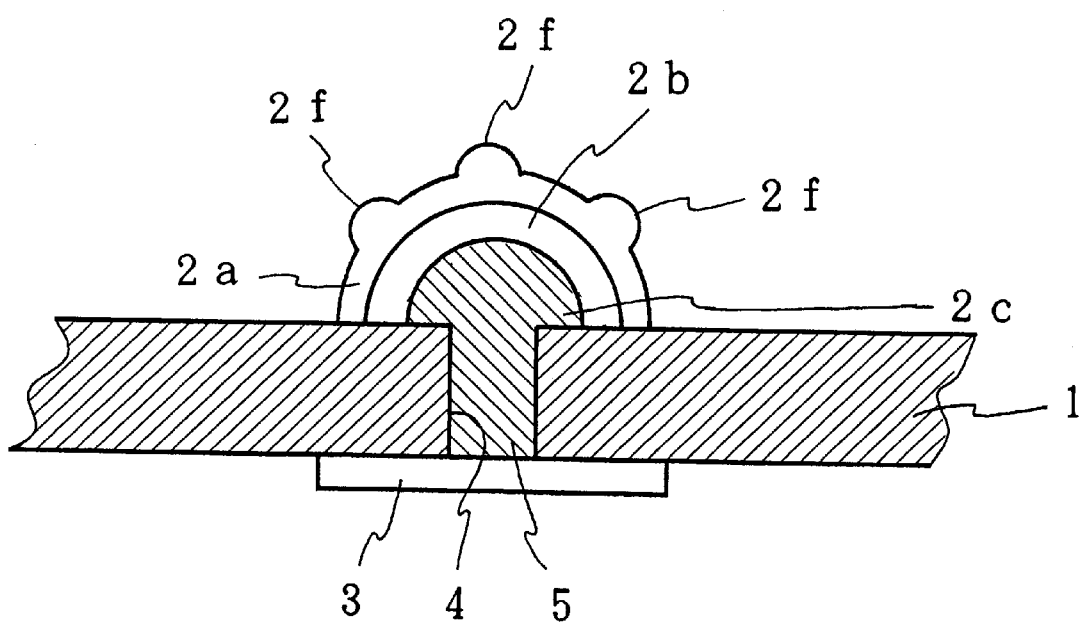
FIG. 4 is a schematic cross section of one embodiment of the probe structure having a sharp protrusion on the surface layer.

After forming deep layer 2c, moreover, crystal state is controlled according to the plating conditions to form protrusions at the contact part 2. This step may be done on any of deep layer 2c, intermediate layer 2b and surface layer 2a. When it is done on surface layer 2a, a protrusion 2f having more sharp point can be formed as shown in FIG. 4.

The sharp protrusion can be formed by plating near a critical current density by manipulations of increasing the current density, lowering metal concentration, weakening agitation and the like.

Alternatively, the crystal particle size can be adjusted by increasing/decreasing the amount of an organic or inorganic additive, using pulse or reversing current for power supply and other methods.

While the shape of the small protrusion on the surface layer 2a is not particularly limited, when an about 100 Å thick oxide film has been formed on the aluminum layer on the pad of the test object, a sharp point thereof is preferable. The sectional shape of the protrusion is preferably a triangle having a height of 0.1–0.8 $\mu$m relative to the base line of 0.1–2.0 $\mu$m in maximum. When the base line is shorter than 0.1 $\mu$m, support strength becomes weaker, while when it is longer than 2.0 $\mu$m, the tip of the protrusion has an obtuse angle which makes breaking an oxide film difficult. When it is smaller than 0.1 $\mu$m in height, it cannot remove the oxide film sufficiently to reach the metal layer under the oxide film and the contact resistance becomes greater. When it is higher than 0.8 $\mu$m, it protrudes the metal layer of aluminum and the like, which in turn causes failure in connection during mounting the test object after testing, or poor electric reliability after connection.

Besides lamination by plating, the protrusion may be formed by abrasing a metal layer by wet or dry etching, pressing with a mold having fine irregularities, or mechanical deformation of the metal by pressing with a nozzle having a similar pattern against the metal spot by spot with a bonder and the like. Such mechanical deformation is preferably performed on the intermediate layer 2b or deep layer 2c having relatively small hardness where forming is easier and cracks are not developed. If it is done on the surface layer 2a, cracks are unbeneficially developed.

While the probe structure of the present invention can function as a probe by itself, it can be prepared into a high function probe card by connecting a multilayer wiring board as shown in the following.

Figure 5:
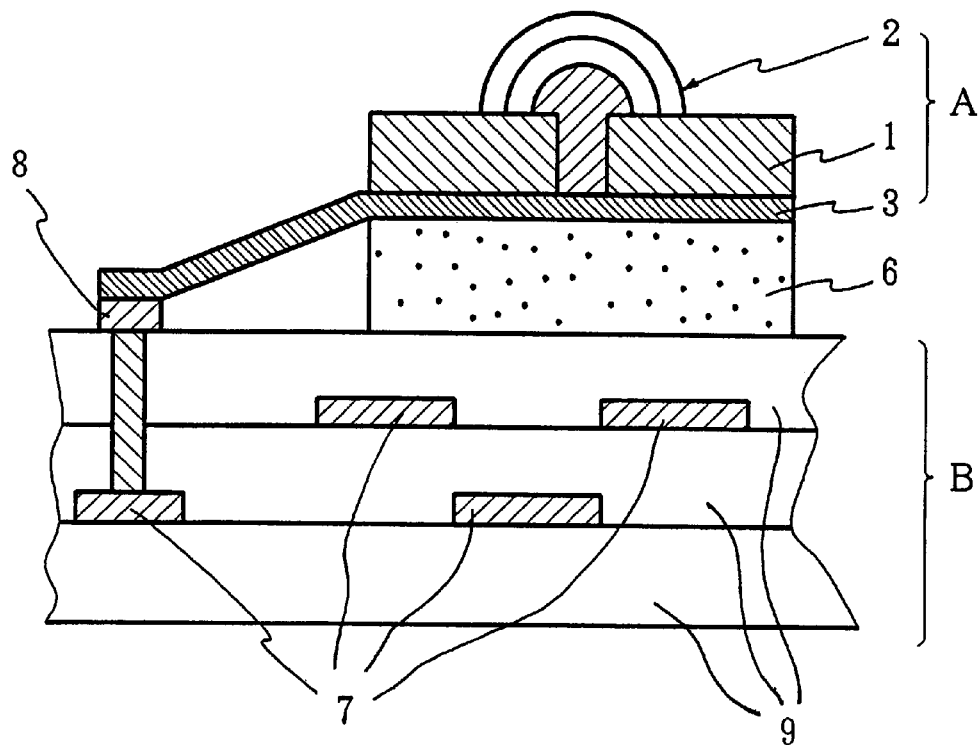
FIG. 5 schematically shows one embodiment of the structure of the probe card comprising the probe structure of the present invention and a multi-layer wiring board.

FIG. 5 schematically shows one example of the structure of said probe card. As shown in this figure, said probe card comprises a probe structure A of the present invention and multilayer wiring board B which are mechanically and electrically connected, wherein said probe structure A is connected onto said multilayer wiring board B via an elastic member 6 such that a stroke movement is allowed with regard to the multilayer wiring board B, and a conductive circuit 3 of the probe structure A and a conductive circuit 7 of the multilayer wiring board B are so connected as not to hinder the above-mentioned stroke movement.

In this figure, the conductive circuit 3 and conductive circuit 7 are connected by extending the conductive circuit 3 to protrude from the end portion of insulating substrate 1, which then gradually descends down toward the surface of multilayer wiring board B and is connected to terminal 8 formed on the surface of the multilayer wiring board B.

Said terminal 8 is connected to the conductive circuit 7 formed in the lower layer of the multilayer wiring board B in a structurally similar way to the conductive path of probe structure A, and then to an external connecting device.

The multilayer wiring board B comprises conductive circuit 7 and insulating layer 9 alternately laminated, and connects circuits in different layers by the structure similar to the conductive path of the probe structure of the present invention. The multilayer wiring board B can be produced by applying multichip module (MCM) substrate techniques, and includes three MCM-D, C and L kinds in the main.

A load voltage can be applied to the test object by serially inserting a resistor (not shown) in the conductive circuit 7 of the multilayer wiring board B, by which overcurrent due to the short circuit of the test object can be prevented. Moreover, noise can be reduced by connecting a capacitor (not shown) parallel to said resistor.

The elastic member 6 may be any as long as it absorbs the difference in distance between the probe structure and test object when the former is brought into contact with the latter, and may be preferably a polymer elastomer such as silicone rubber, fluorine rubber, urethane rubber and the like.

The elastic member 6 can be formed on the multilayer wiring board B by cutting an elastic sheet member 6 and adhering same, or direct formation by screen printing, photolithography and the like.

The thickness of the elastic member 6 is 5–1000 $\mu$m, preferably 20–500 $\mu$m, so that is can ensure electric connection between conductor part of the test object and contact part 2 of probe structure by absorbing the difference in height of terminals of the test object when a small conductor part such as IC pad is the contact object.

The external device to be connected may be, besides separate testing device such as a tester, a device used for matching impedance between test object and wiring circuit or other IC to be connected in a later stage as a product.

Figure 6:
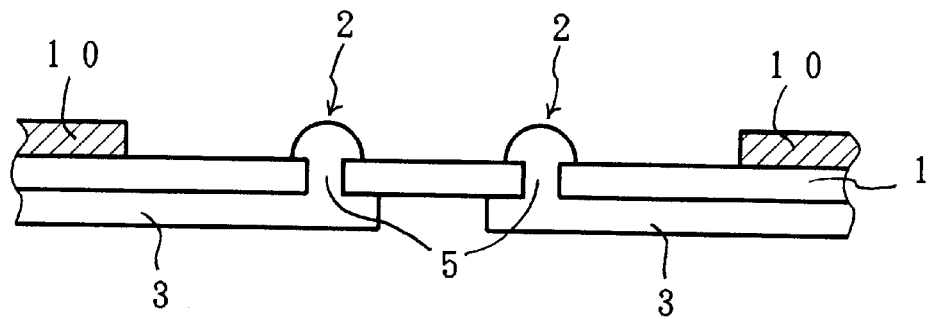
FIG. 6 is a schematic cross section of a first embodiment of the probe structure wherein a rigid substrate has been integrated.
Figure 7:
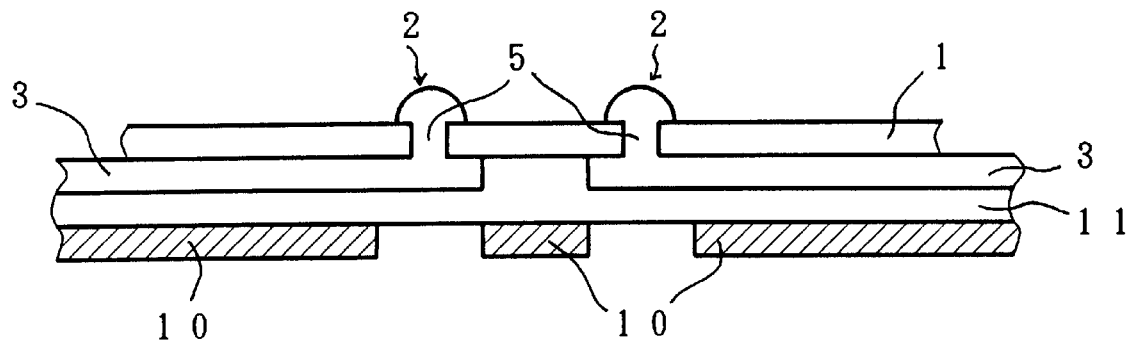
FIG. 7 is a schematic cross section of a second embodiment of the probe structure wherein a rigid substrate has been integrated.

Once the probe structure of the present invention is integrated with a rigid substrate, the flexible structure turns into a strong one which is easy to handle. FIGS. 6 and 7 show cross sections of an example of the probe structure wherein a rigid substrate is integrally formed. The probe structure shown in FIG. 6 is basically the same with the probe structure shown in FIG. 1 except that a rigid substrate 10 is formed on the outer periphery of the contact part 2 of the insulating substrate 1. In the probe structure shown in FIG. 7, conductive circuit 3 is covered with an insulating layer 11 made from polyimide and the like and a rigid substrate 10 is formed on the insulating layer 11 except the neighborhood region of contact part 2. The rigid substrate 10 may be any as long as it can be integrally formed on the outer periphery of the flexible probe structure and may have any form in practical use.

The material of rigid substrate 10 may be a glass epoxy substrate, a resin substrate of, for example, BT resin, or an inorganic substrate including ceramics such as alumina and silicon nitride, or an alloy such as 42 alloy. For lower linear expansion coefficient, the use of the inorganic substrate is preferable. For example, such an inorganic substrate is adhered to the entirety of insulating layer 11 of the probe structure or to the region excluding the neighborhood region of contact part 2 as shown in FIG. 7, or a rigid substrate 10 is integrated with the outer periphery alone of the probe structure and a shrinkage stress is intentionally developed in the probe structure by heating the integrated probe, or other method. In such probe structure, a tension can be set to be always produced in the substrate expansion direction (outward direction) at a temperature in the range employed in burn-in cycle process, and the apparent linear expansion coefficient can be made smaller.

The probe structure shown in FIG. 7 can be also formed by removing a neighborhood region of contact part 2 by etching after the rigid substrate 10 is adhered to the entirety of the insulating layer 11. In this way, an opening is formed in the neighborhood region of contact part 2 of the substrate to allow expression of appropriate cushioning property in response to the pressure applied, thus improving the contact reliability.

The linear expansion coefficient of the rigid substrate 10 may be set according to the object to a value equal to or different from the linear expansion coefficient of the test object. Moreover, one having a linear expansion coefficient of 1–8 ppm may be used as the rigid substrate 10 and integrated with the probe structure, whereby the obtained probe structure comes to have a low linear expansion coefficient. According to such probe structure, problems due to defective alignment and damages to electrode, which problems being caused by the mismatch in linear expansion coefficient of the probe structure and the test object bare die or wafer, can be avoided to result in markedly improved reliability.

The probe structure of the present invention is explained in more detail by way of Examples.

EXAMPLE 1

<Preparation of insulating substrate and conductive circuit>

A polyimide precursor solution was applied onto a 35 μm thick copper foil such that the thickness after drying became 25 μ. Drying and curing gave a two-layer film of the copper foil and the polyimide film (insulating substrate).

Then, a resist layer was formed on the surface of the copper foil in a circuit pattern, which was then subjected to photo process to give a conductive circuit having a desired circuit pattern.

A polyimide precursor solution was applied on the circuit pattern side such that the thickness after drying became 10 μm. Drying and curing gave a cover coat.

<Preparation of conductive path and deep layer>

A KrF eximer laser beam (oscillation wavelength 248 nm) was irradiated through a mask to the area right in the back of the above-mentioned conductive circuit of the polyimide film, in the direction perpendicular to the polyimide film surface for dry etching to form a φ60 μm fine through-hole in the polyimide film thus exposing the conductive circuit in said through-hole.

<Resist protection of conductive circuit side>

A vinyl chloride resist was applied by printing at 75 mesh and dried at 170° C. for 20 minutes.

<Pretreatment of inside of through-hole>

Ultraviolet light was irradiated into the through hole for 10 minutes to impart wettability. To remove polyimide product decomposed by eximer laser, the following desmear treatment was applied [permanganate oxidizing agent, 75° C., 3 min., immersion, sulfuric reducing agent, 50° C., 1 min., immersion].

A sodium persulfate soft etching solution was ultrasonicated (40 kHz) at 25° C. for 1 minute to remove decomposed product on copper in the through-hole.

<Preparation of deep layer>

A treatment at 60° C., 5 A/dm$^2$, for 39 minutes using a Watt bath nickel plating (composition: nickel sulfide 300 g/l, nickel chloride 65 g/l, boric acid 45 g/l), while changing real current according to the growing area of plating, gave 13 μm protrusion from the surface of polyimide film (end portion of opening of through-hole) to form a deep layer. Intermittent air agitation (5 minutes halt, 20 seconds drive) was applied during growth of plating. The hardness of the deep layer was 250 Hk.

<Pretreatment of intermediate layer>

A 0.5 μm intermediate layer was laminated on the deep layer by gold cyanate plating with constant real current at 67° C., 0.6 A/dm$^2$ for 90 seconds. The vertical jet in the plating bath was set to 40 l/min and oscillation of the plating object was set to 3 m/min. The hardness of the intermediate layer was 100 Hk.

<Pretreatment of surface layer>

A 2 μm surface layer was laminated on the intermediate layer by rhodium sulfate plating with constant real current at 50° C., 1.9 A/dm$^2$ for 6 minutes. The liquid circulation in the plating bath was set to 2 l/min and oscillation of the plating object was set to 1 m/min. The hardness of the surface layer was 850 Hk. The tensile stress of the surface layer as measured by a spiral deformeter was 46 kg/mm$^2$.

<Peeling of resist on the conductive circuit side>

The resist layer applied to the surface of the conductive circuit was peeled off to give a probe having a mushroom-shaped bump contact part.

<Electric resistance test>

Figure 8:
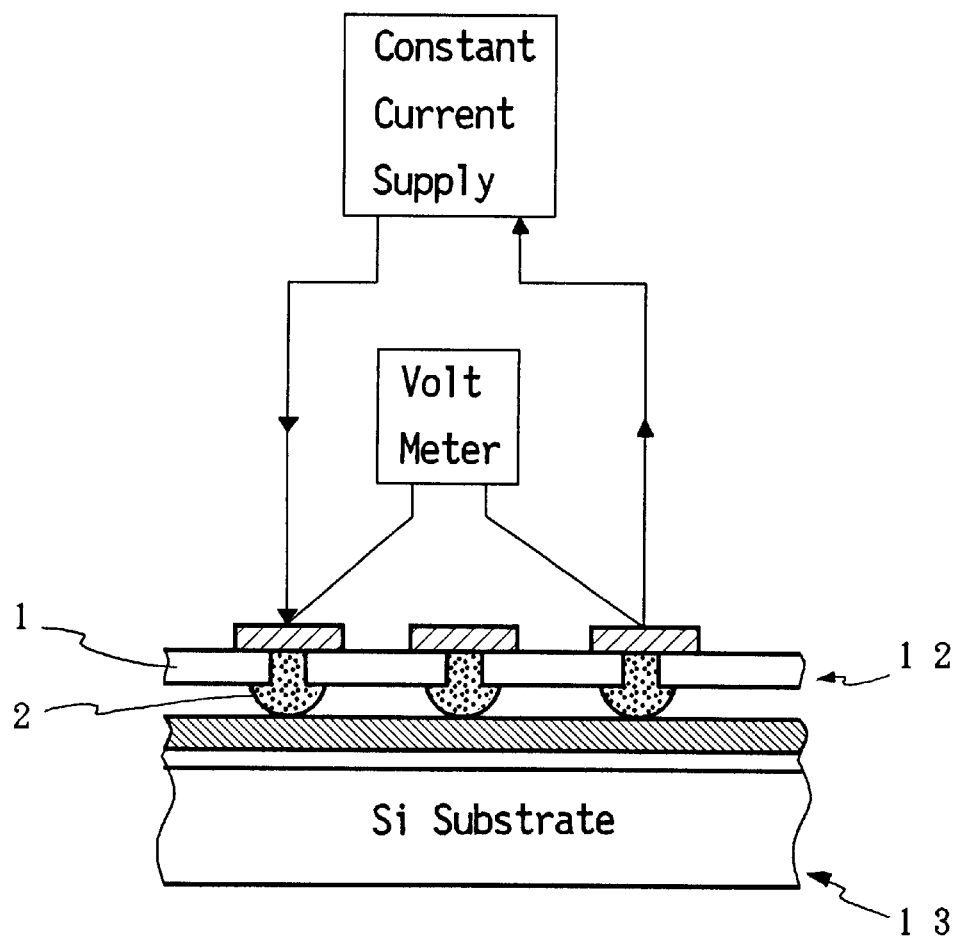
FIG. 8 is a conceptional measurement drawing of electrical resistance test for examining the contact resistance of a probe.
Figure 9:
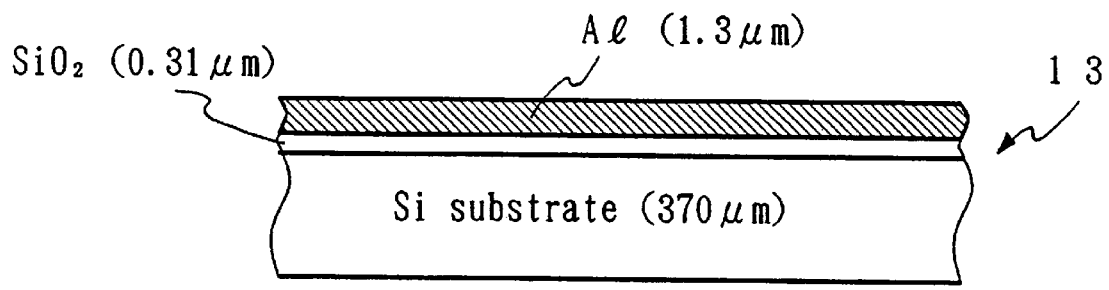
FIG. 9 is an enlarged cross section schematically showing one embodiment of IC.
Figure 10:
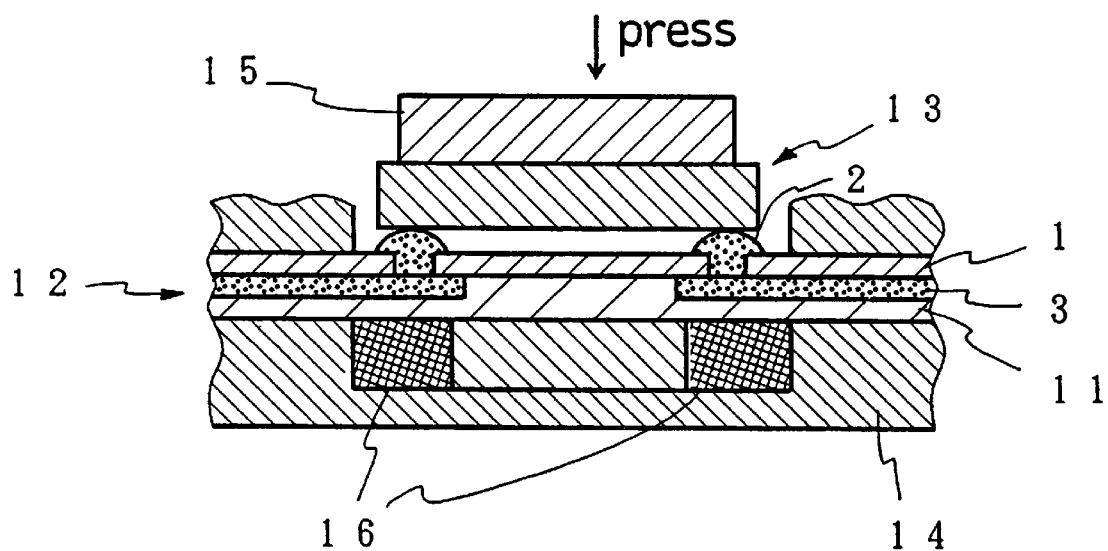
FIG. 10 is a conceptional drawing of contact between bump and IC in a carrier.

The contact resistance of the obtained probe was examined by flowing 1 mA measurement current and measured with a tester having an electric circuit. FIG. 8 shows a concept drawing of the measurement, wherein the contact part 2 having a height of 15±2 μm from the surface of the polyimide film 1 of the probe structure 12 was brought into contact with an aluminum electrode of IC 13 shown in FIG. 9 and the contact resistance at the two points was examined according to the load. To be specific, as shown in the concept drawing of contact of FIG. 10, the probe structure 12 is disposed in the carrier 14, IC 13 is pressured via a presser plate 15, and a compliance member 15 is installed on the pressure initiation side from the contact part 2 to make the contact of each contact part 2 and electrode of IC 13 uniform.

Figure 11:
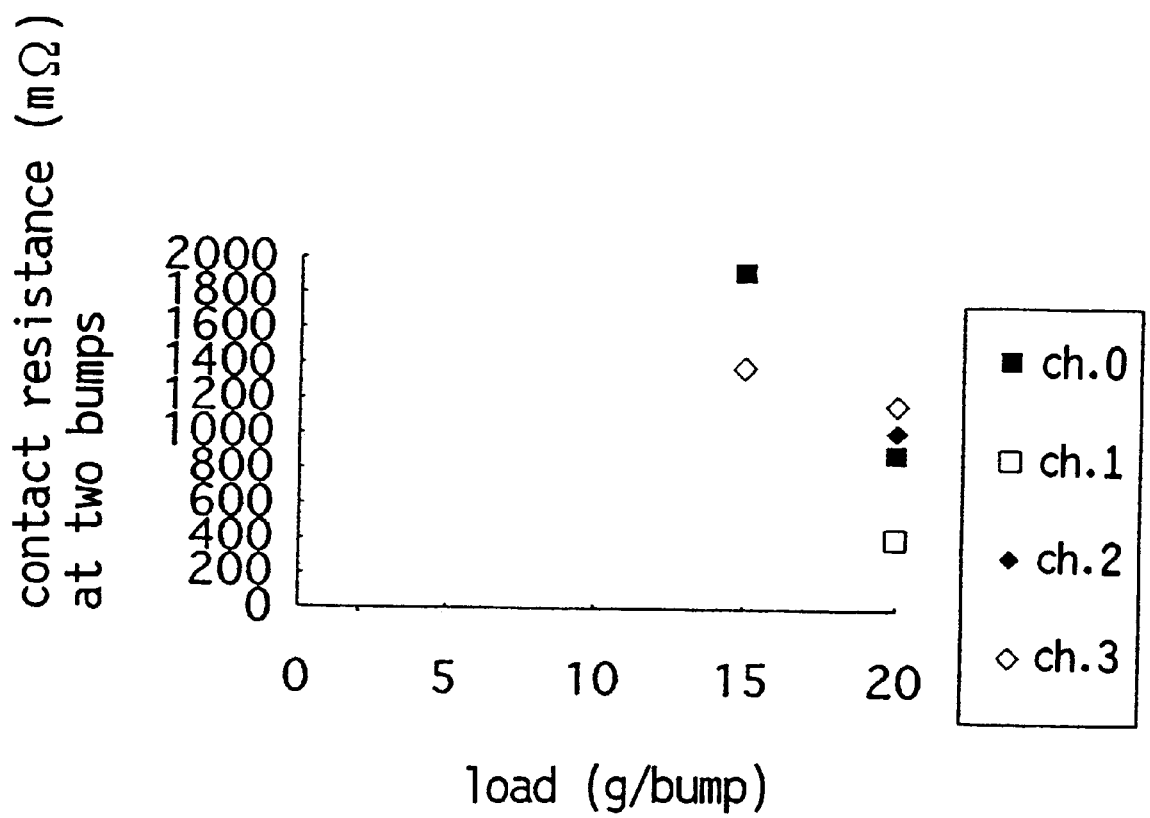
FIG. 11 is a graph showing the measurement results of load-contact resistance of Example 1.
Figure 12:
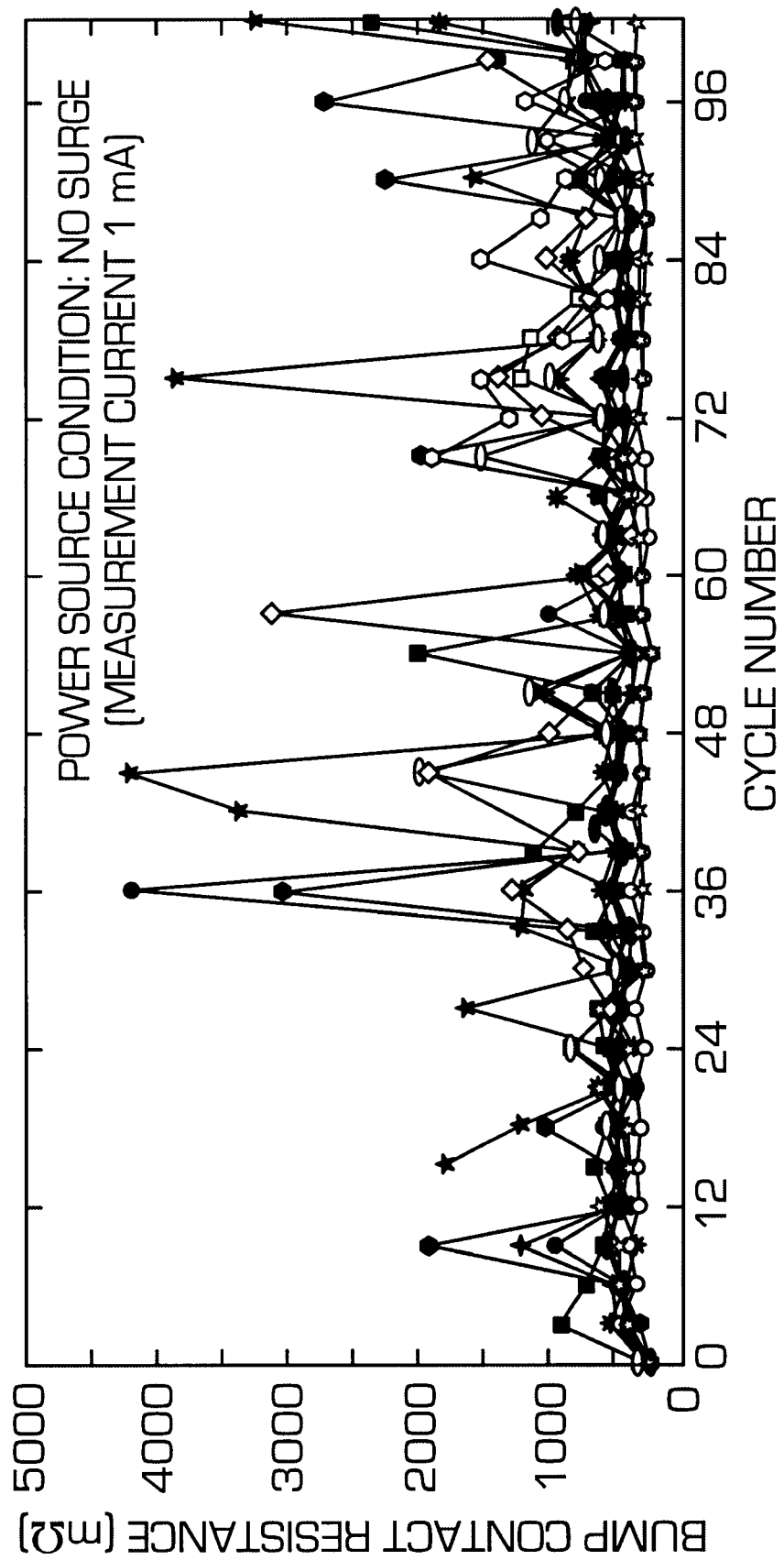
FIG. 12 is a graph showing the results of heat cycle test of Example 1.

The contact resistance according to varying loads was as shown in the graph of FIG. 11. The contact resistance was always not more than 2000 mΩ, though some dispersion in the value was observed. A load 37 g/bump, heat cycle test was repeated 102 times at 25° C., 30 min. −150° C., 20 min. As a result, some bump (contact part) showed resistance of more than 2000 mΩ, as shown in the graph of FIG. 12. However, the rhodium surface layer after the heat cycle test did not have flaw, crack or corrosion, nor was there found transfer or adhesion due to diffusion of aluminum of IC. Note that in FIG. 11, "ch." means a certain bump subjected to measurement (hereinafter the same).

COMPARATIVE EXAMPLE 1

In the same manner as in Example 1 except that the surface layer rhodium was not formed and procedure for forming an intermediate layer was continued for 6 minutes after the deep layer was formed, a gold probe having a 2 μm gold layer laminated on the nickel deep layer was obtained. The hardness of the surface gold layer was 100 Hk.

In the same manner as in Example 1, aluminum IC electrode was contacted with the contact part and the contact resistance was examined by flowing 100 mA measurement current and measured with a tester. The testing conditions were load 37 g/bump, 150° C., 1002 hours of measurement.

Figure 13:
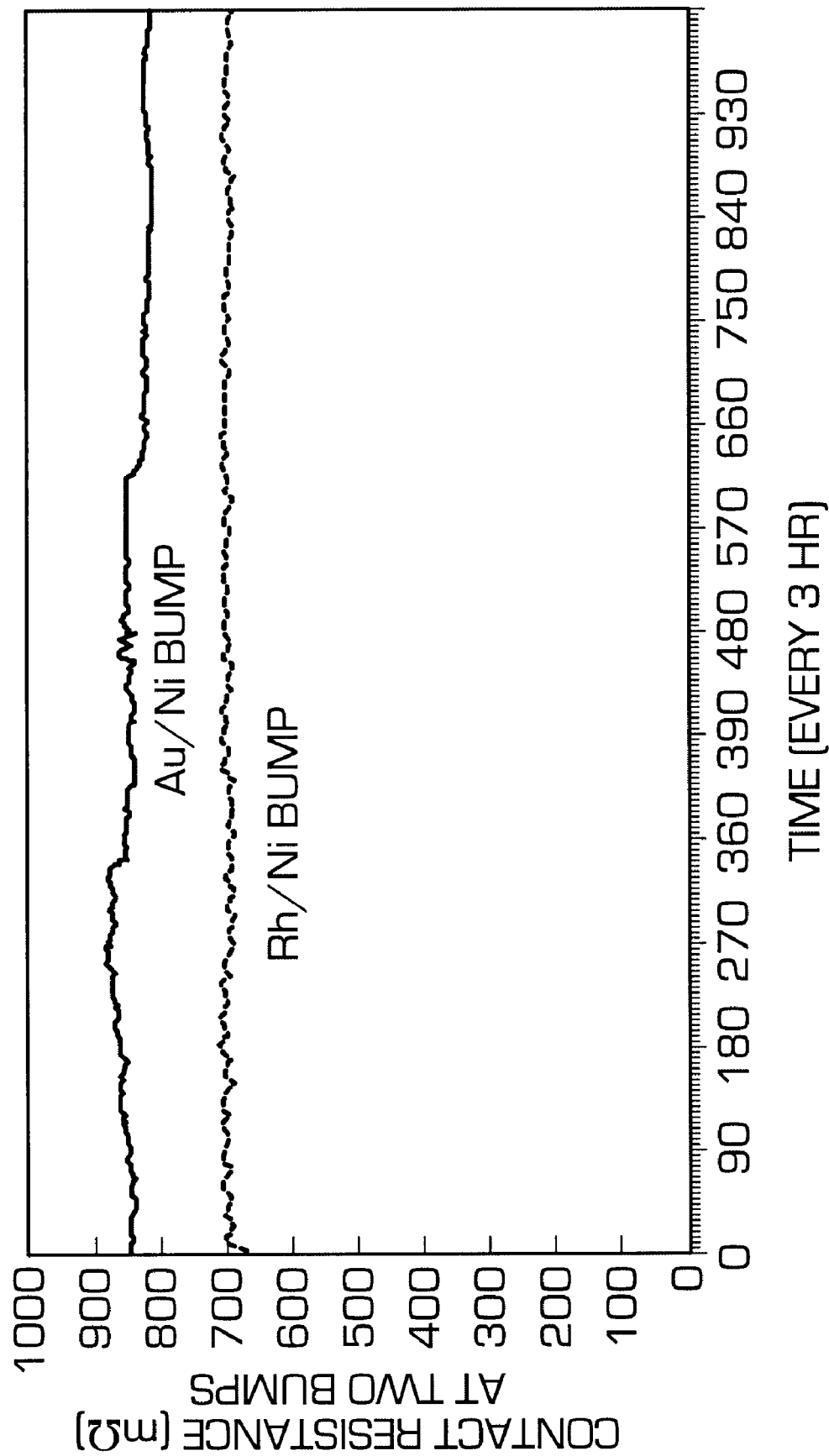
FIG. 13 is a graph showing the values of contact resistance of rhodium probe of Example 1 and gold probe of Comparative Example 1.

As a result, the gold probe showed about 150 mΩ higher contact resistance as compared to the rhodium probe of Example 1, as shown in the graph of FIG. 13, and the gold probe showed transfer of aluminum on its surface.

A 15 μm solder (Sn:Pb=6.4) plating was applied to copper surface of a two-layer substrate consisting of copper layer (35 μm)/polyimide layer (25 μm). The above-mentioned rhodium probe and contact part of the gold probe were brought into contact with the plated solder, and the contact resistance was examined by flowing 100 mA measurement current and measured with a tester. Every probe showed 1 Ω resistance at load 37 g/bump in the initial evaluation. The probes were subjected to heat cycle test at 25° C., 30 min–150° C., 20 min. As a result, the gold probe showed transfer of solder to the surface at the second testing, whereas the rhodium probe did not show transfer of solder even after 50 times of testing, and resistance was stable at 1 Ω.

EXAMPLES 2, 3

The deep layer of Example 1 was changed to a mushroom shape bump formed by copper plating whose steps and composition are shown in the following Table 1. In addition, copper plating was applied according to the operation conditions of Tables 2 (Example 2) and 3 (Example 3), to form an irregular layer between the deep layer and intermediate layer.

TABLE 1

| | |
|---|---|
| copper plating step: sulfate | 30 l/min |
| 25° C., 5 A/dm², 39 min, liquid circulation | |
| copper plating composition: copper sulfate | 75 g/l |
| 97 v/v% sulfuric acid | 190 g/l |
| chlorine ion | 60 ppm |
| ethylene glycol | 5 ml/l |

TABLE 2

| | |
|---|---|
| copper plating step: sulfate | |
| 25° C., 34 A/dm², 10 sec, immersion | |
| copper plating composition: copper sulfate | 75 g/l |
| 97 v/v% sulfuric acid | 190 g/l |
| chlorine ion | 60 ppm |
| ethylene glycol | 5 ml/l |

TABLE 3

| | |
|---|---|
| copper plating step: sulfate | — |
| 25° C., 5 A/dm², 1 min, immersion | |
| copper plating composition: copper sulfate | 75 g/l |
| 97 v/v% sulfuric acid | 190 g/l |
| chlorine ion | 600 ppm |
| ethylene glycol | 5 ml/l |

An irregular deep layer was formed by changing the deep layer preparation of Example 1 to the steps and compositions shown in Tables 1 and 2. Then, in the same manner as in Example 1, the 0.5 μm gold intermediate layer and 2 μm rhodium surface layer were laminated to give a high current density irregular probe (Example 2) having spherical particles of about 2 μm in diameter formed on the surface thereof. By changing the deep layer preparation of Example 1 to the steps and compositions shown in Tables 1 and 3, an irregular probe (Example 3) from a high chlorine ion bath was obtained in the same manner, which had spherical particles of about 0.5 μm in diameter formed on the surface thereof.

The hardness of each layer of the high current density irregular probe of Example 2 was 190 Hk at the deep layer, 100 Hk at the intermediate layer and 850 Hk at the surface layer. The tensile stress of the surface layer as measured by a spiral deformeter was 46 kg/mm².

The hardness of each layer of the irregular probe of Example 3 from a high chlorine ion bath was the same as that in Example 2, and 190 Hk at the deep layer, 100 Hk at the intermediate layer and 850 Hk at the surface layer. The tensile stress of the surface layer as measured by a spiral deformeter was 46 kg/mm².

In the same manner as in Example 1 and using the above-mentioned two kinds of irregular probes, the contact part of each irregular probe was brought into contact with the aluminum IC electrode and the contact resistance test was carried out using a tester by flowing 1 mA measurement current.

Figure 14:
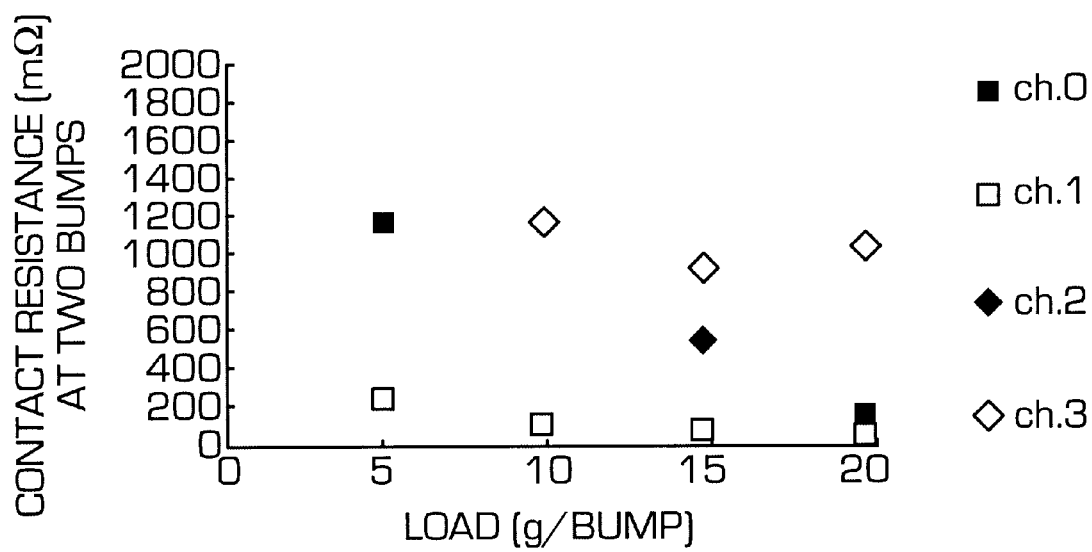
FIG. 14 is a graph showing the measurement results of load-contact resistance of Example 2.
Figure 15:
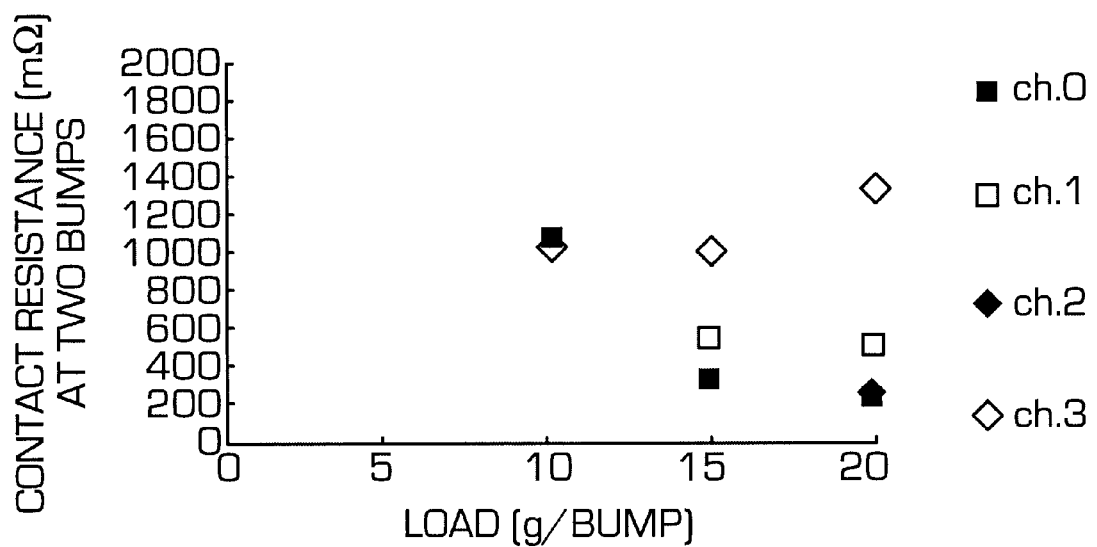
FIG. 15 is a graph showing the measurement results of load-contact resistance of Example 3.

The relationship between load and contact resistance is shown in FIGS. 14 and 15. FIG. 14 shows the results obtained using a high current density irregular probe. Although some dispersion was found at the load of 10 g/bump, the resistance was not more than 200 mΩ and 36 mΩ at minimum. FIG. 15 shows the results obtained using an irregular probe from a high chlorine ion bath, wherein at a load of 20 g/bump, the resistance was not less than 200 mΩ and not more than 1600 mΩ, which results being somewhat lower than those of the probe structure of Example 1.

EXAMPLE 4

In the same manner as in Example 2 or Example 3, the deep layer was formed from copper by the step of Table 1. The polyimide film having irregularities was brought into contact with a copper bump, and pressed by a press. As a result, the copper bump was deformed into a columnar shape and 9 cone shape protrusions (diameter 10 μm, height 5 μm)/bump were simultaneously formed on the surface of the copper bump.

An activation treatment by soft etching was applied, and in the same manner as in Example 1, the 0.5 μm gold intermediate layer and 2 μm rhodium surface layer were laminated to give a press irregular probe.

The hardness of each layer of the press irregular probe was 190 Hk at the deep copper layer, 100 Hk at the intermediate layer and 850 Hk at the surface layer. The tensile stress of the surface layer as measured by a spiral deformeter was 46 kg/mm².

In the same manner as in Example 1, the contact part (bump) of the press irregular probe was brought into contact with an aluminum IC electrode and the contact resistance test was carried out using a tester by flowing 1 mA measurement current.

Figure 16:
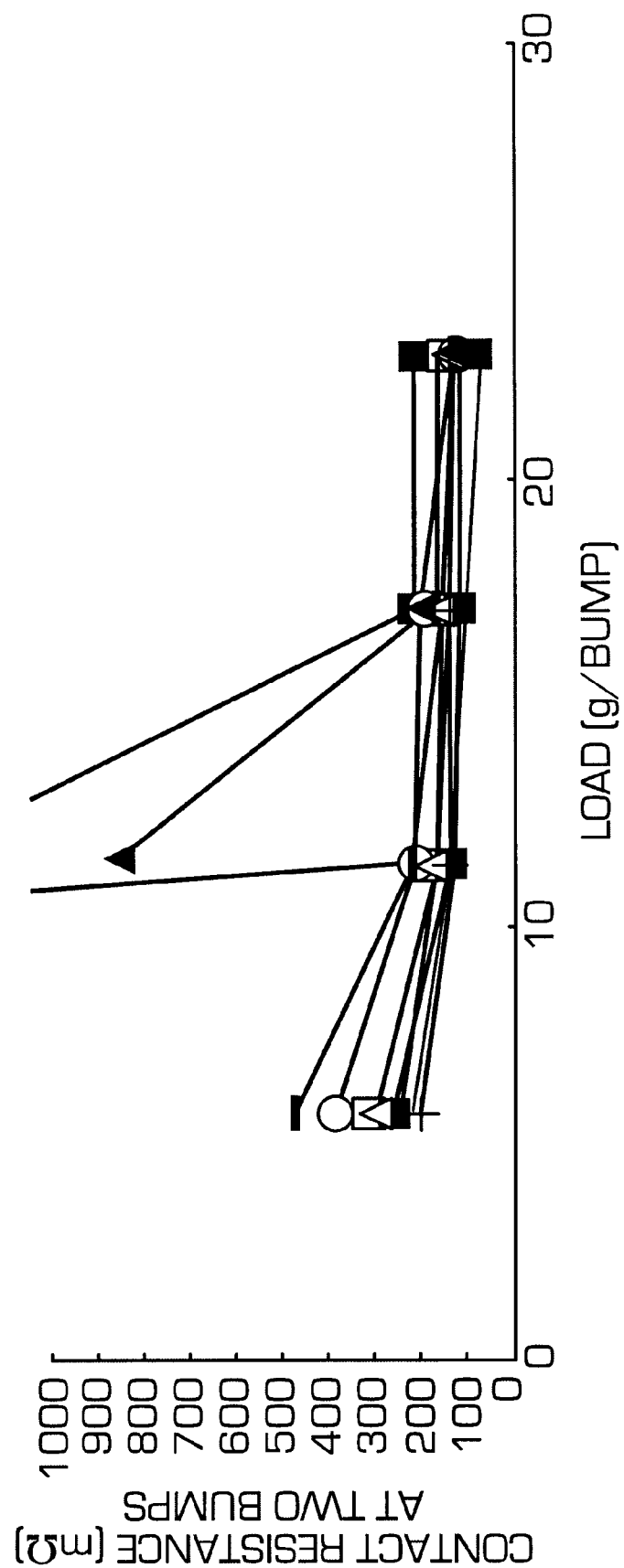
FIG. 16 is a graph showing the measurement results of load-contact resistance of Example 4.

The relationship between load and contact resistance is shown in FIG. 16. The result was that contact resistance was stable at not more than 200 mΩ at a load of 22.9 g/bump.

EXAMPLE 5

In the same manner as in Example 1 except that the deep layer was formed by 64 minutes long nickel plating and that the surface layer was formed at a current density changed from 1.9 A/dm$^2$ to 3 A/dm$^2$, a probe was obtained which had a height from the surface of the polyimide film to the contact part of 40±5 μm, a 0.5 μm thick gold intermediate layer and a 2 μm thick rhodium surface layer having small irregularities.

The hardness of each layer of this probe was 250 Hk at the deep layer, 100 Hk at the intermediate layer and 850 Hk at the surface layer. The tensile stress of the surface layer as measured by a spiral deformeter was 40 kg/mm$^2$.

In the same manner as in Example 1, the contact part (bump) of the probe was brought into contact with an aluminum IC electrode and the contact resistance test was carried out using a tester by flowing 1 mA measurement current.

Figure 17:
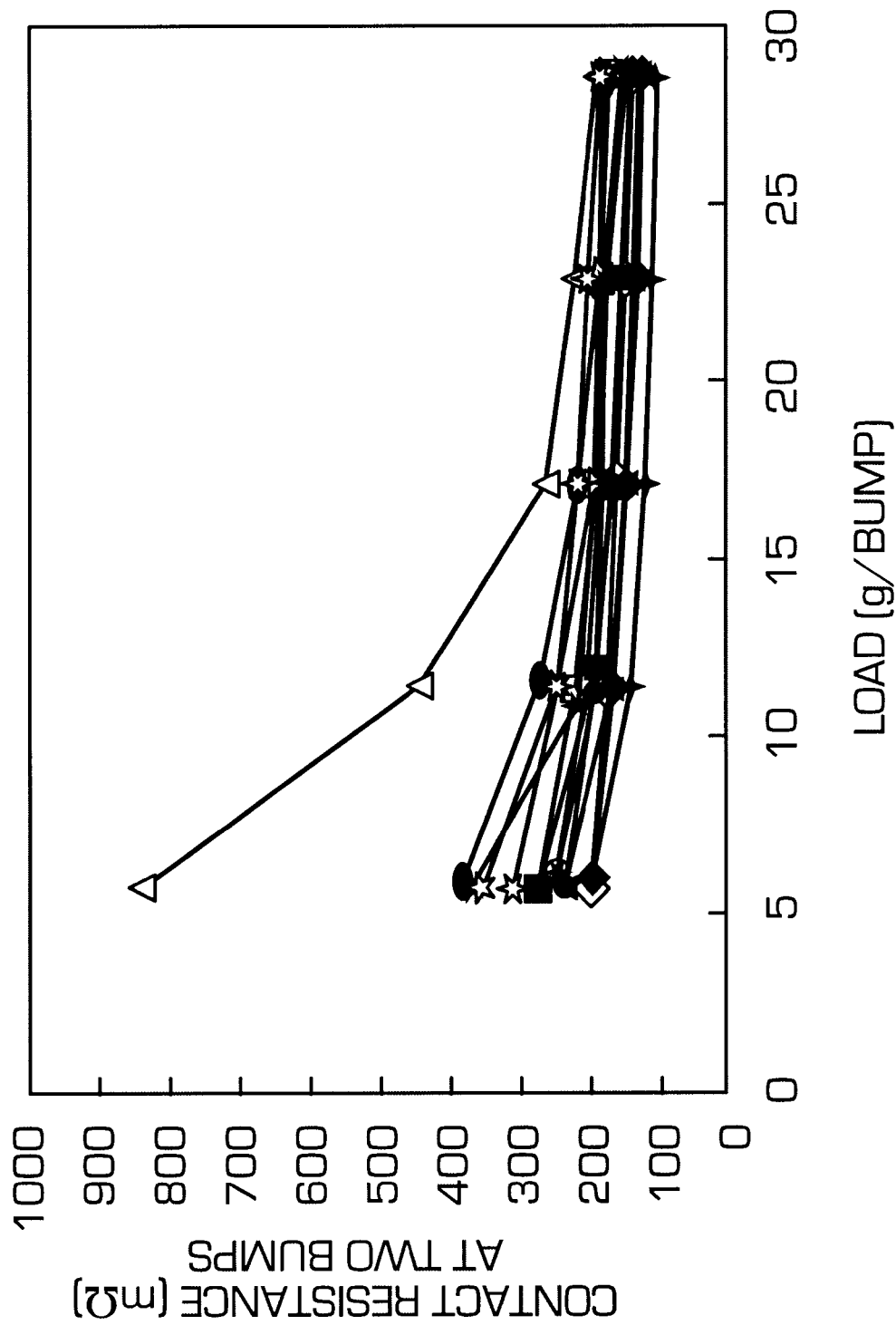
FIG. 17 is a graph showing the measurement results of load-contact resistance of Example 5.

The relationship between load and contact resistance is shown in FIG. 17. The result was that contact resistance was 200–400 mΩ at a load of 11.4 g/bump and 100–200 mΩ at a load of 28.6 g/bump. After the test, rhodium surface layer did not have a crack and was free of the problem of penetrating the aluminum electrode.

While the small irregularities on the surface layer had nonuniform shapes, the perpendicular section of the irregularities as measured with a laser microscope was a triangle with a round point wherein the height was 0.2–0.4 μm and the base line was 0.8–1.6 μm.

EXAMPLE 6

In the same manner as in Example 5 except that surface layer rhodium was formed at current density 1.9 A/dm$^2$ for 6 minutes, a probe consisting of nickel deep layer, 0.5 μm gold intermediate layer and 2 μm rhodium surface layer was obtained in which the height of the contact part from the surface of the polyimide film was 40±5 μm.

The hardness of each layer of this probe was 250 Hk at the deep layer, 100 Hk at the intermediate layer and 850 Hk at the surface layer. The tensile stress of the surface layer as measured by a spiral deformeter was 46 kg/mm$^2$.

In the same manner as in Example 1, the both contact parts (bumps) of the probe were brought into contact with an aluminum IC electrode and the contact resistance test was carried out using a tester by flowing 1 mA measurement current.

As a result, the surface layer was free of cracks and had a dull appearance with small irregularities. When compared to the bump of Example 5, the irregularities were small and nonuniform. The perpendicular section of the irregularities as measured with a laser microscope was a triangle with a round point wherein the height was 0.1–0.2 μm and the base line was 0.4–0.6 μm.

Figure 18:
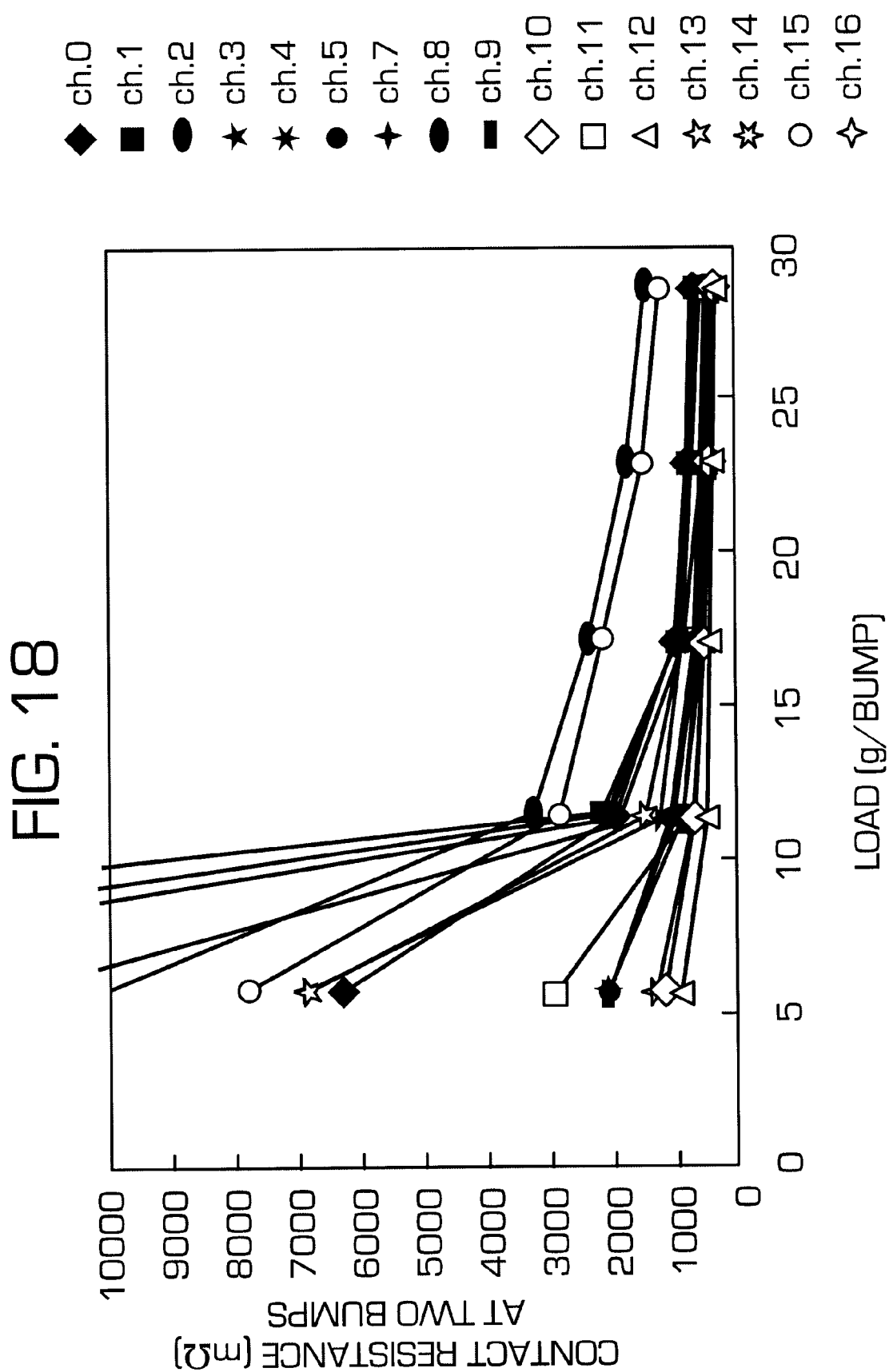
FIG. 18 is a graph showing the measurement results of load-contact resistance of Example 6.

The relationship between load and contact resistance is shown in FIG. 18. The result was that contact resistance was as high as 500–4000 mΩ at a load of 11.4 g/bump.

The test object to which the probe structure of the present invention intends contact and connection has small conductor part such as semiconductor element, assembly of semiconductor elements (e.g., silicon wafer before dicing and silicon chip after dicing), device including a semiconductor element, a circuit substrate to mount said device, circuit substrate for LCD, and the like. Such conductor part includes a bump made from a solder (tin, zinc or alloy mainly comprising these two metals) or gold.

The conductor part of the test object means every conductor constituting the circuit of the test object, such as any optional part of various elements, electrode thereof and circuit pattern thereof. Particularly in practice, terminal, pad, land and the like that a small test object possesses for intended electric contact and connection with other conductor become the important contact objects.

INDUSTRIAL FIELD OF UTILIZATION

The probe structure of the present invention can prevent transfer and diffusion of base metal such as aluminum used for the conductor part of the test object to the contact part as a result of the action of the hard metal, particularly hard precious metal, used for the surface layer of the contact part. In addition, the probe structure is strong against corrosion and can maintain low contact resistance.

Inasmuch as a hard and corrosion resistant precious metal is used for the surface layer of the contact part, the test object solder bump is devoid of transfer and diffusion of solder to and on the contact part, thereby maintaining low resistance.

In addition, the soft metal used for the intermediate layer to be the base adhesive layer of the surface layer alleviates the stress produced by the contact with the test object, thus inhibiting damages such as cracks.

The present invention suffers less from deterioration of contact state after repetitive open/close contact with the test object in electric test, in particular a burn-in test, of small objects such as IC and semiconductor element, as compared to the initial contact state, and highly reliable, stable electric testing can be performed.

What is claimed is:

1. A probe structure comprising a conductive contact part formed on one side of an insulating substrate, a conductive circuit formed on the other side of the insulating substrate, wherein the contact part and the conductive circuit are connected via a conductive path formed in a through-hole formed in the thickness direction of the insulating substrate, and the contact part comprises a deep layer comprising copper, nickel, nickel alloy or a laminate structure of a nickel layer and a copper layer, wherein said deep layer has a hardness of not less than 100 Hk and not more than 700 Hk, an intermediate layer comprising gold, palladium, silver, indium or platinum, wherein said intermediate layer has a hardness of not less than 10 Hk and not more than 300 Hk, and a surface layer comprising rhodium, ruthenium, cobalt-tungsten alloy, chromium, iron-tungsten alloy or chromium-molybdenum alloy, wherein said surface layer has a hardness of not less than 700 Hk and not more than 1200 Hk, successively laminated.

2. The probe structure of claim 1, wherein the deep layer has a hardness of not less than 100 Hk and less than 300 Hk.

3. The probe structure of claim 1, wherein the surface layer has a tensile stress at the contact part of not more than 50 kg/mm$^2$.

4. The probe structure of claim 1, wherein the contact part comprises a rhodium surface layer, a gold intermediate layer and a deep layer which is a nickel layer or copper layer, or a laminate of a nickel layer and a copper layer.

5. The probe structure of claim 1, wherein the intermediate layer at the contact part has a thickness of not less than 0.01 μm and not more than 3 μm and the surface layer at the contact part has a thickness of not less than 0.5 μm and not more than 10 μm.

6. The probe structure of claim 1, wherein at least one of the surface layer, the intermediate layer and the deep layer at the contact part is formed by plating.

7. The probe structure of claim 1, wherein the contact part comprises a rhodium surface layer, a gold intermediate layer and a nickel deep layer.

8. The probe structure of claim 1, wherein the deep layer consists essentially of copper, nickel, nickel alloy or a laminate structure of a nickel layer and a copper layer, the intermediate layer consists essentially of gold, palladium, silver, indium or platinum, and the surface layer consists essentially of rhodium, ruthenium, cobalt-tungsten alloy, chromium, iron-tungsten alloy or chromium-molybdenum alloy.

* * * * *

UNITED STATES PATENT AND TRADEMARK OFFICE
CERTIFICATE OF CORRECTION

PATENT NO. : 5,977,783
DATED : November 2, 1999
INVENTOR(S) : Yoshimari Takayanna, Toshikazu Baba, Atsushi Hino, Ichihro Amino It is certified that error appears in the above-identified patent and that said Letters Patent is hereby corrected as shown below:

Title Page,
In the section "[30] Foreign Application Priority Data" appearing on the cover sheet of the patent : '8-265621 -- .

Signed and Sealed this

Twenty-eighth Day of August, 2001

*Attest:*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO.    : 5,977,783
DATED         : November 2, 1999
INVENTOR(S)   : Yoshimari Takayanna, Toshikazu Baba, Atsushi Hino and Ichihro Amino It is certified that error appears in the above-identified patent and that said Letters Patent is hereby corrected as shown below:

<u>Title page,</u>
In the section "[30] Foreign Application Priority Data" appearing on the cover sheet of the patent: change "8-265621" to -- 6-265621 --.

This certificate supersedes Certificate of Correction issued August 28, 2001.

Signed and Sealed this

Sixteenth Day of July, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 5,977,783
DATED        : November 2, 1999
INVENTOR(S)  : Yoshimari Takayanna, Toshikazu Baba, Atsushi Hino and Ichiro Amino It is certified that error appears in the above-identified patent and that said Letters Patent is hereby corrected as shown below:

<u>Title page,</u>
Item "[30] Foreign Application Priority Data" appearing on the cover sheet of the patent: change "8-265621" to -- 6-265621 --.

This certificate supersedes Certificate of Correction issued July 16, 2002.

Signed and Sealed this

Eighth Day of October, 2002

*Attest:*

*Attesting Officer*

JAMES E. ROGAN
*Director of the United States Patent and Trademark Office*